United States Patent [19]

Schultz

[11] Patent Number: 4,897,580
[45] Date of Patent: Jan. 30, 1990

[54] AMPLIFIER DRIVE CIRCUIT FOR INDUCTIVE LOADS

[75] Inventor: Warren J. Schultz, Tempe, Ariz.
[73] Assignee: Motorola Inc., Schaumburg, Ill.
[21] Appl. No.: 369,413
[22] Filed: Jun. 20, 1989
[51] Int. Cl.$^4$ .......................... H01J 29/70; H01J 29/76
[52] U.S. Cl. ...................................... 315/408; 315/399
[58] Field of Search ................................ 315/408, 399

[56] References Cited

U.S. PATENT DOCUMENTS

| | | | |
|---|---|---|---|
| 3,480,826 | 11/1969 | Xenakis | 315/27 |
| 3,501,672 | 3/1970 | Xenakis | 315/27 |
| 4,205,259 | 5/1980 | Schindler | 315/408 |
| 4,227,123 | 10/1980 | Dietz | 315/408 |
| 4,642,533 | 2/1987 | Carpenter | 315/408 |
| 4,670,692 | 6/1987 | Meigs | 315/408 |

*Primary Examiner*—Theodore M. Blum
*Attorney, Agent, or Firm*—Robert M. Handy

[57] ABSTRACT

A transformer coupled amplifier drive circuit (60) and method especially suited for providing a saw-tooth current waveform to an inductive load (32) for horizontal deflection applications in CRT monitors and the like are described. The transformer primary (48) is coupled between the power source connection (11) and the input of the amplifier (26) while the transformer secondary (50) has an opposite polarity terminal coupled to the input of the amplifier (26) through an inductor (52) and the other terminal of the secondary (50) coupled to the common terminal (15) of the amplifier (26) through a diode (56).

When the input switch (44) is closed, the input of the amplifier (26) is energized by a current (65) through the series connected primary (48) and energy is stored in the transformer magnetizing field and in the amplifier (26). Conduction in the transformer secondary (50) is blocked by the diode (56).

When the input switch (44) is opened, the input charging current (65) stops and the collapsing primary magnetizing field produces an oppositely directed current (67) which flows through the secondary winding (50), the diode (56), the series connected inductor (52) and the input to the amplifier (26). The demagnetization energy stored in the transformer (48) cancels the energy stored in the amplifier (26), thereby reducing total dissipation, and the inductor (52) controls the fall time independent of the rise time.

14 Claims, 2 Drawing Sheets 4,897,580

AMPLIFIER DRIVE CIRCUIT FOR INDUCTIVE LOADS

FIELD OF THE INVENTION

The present invention relates to means and methods for power amplifiers and, in particular, power amplifiers capable of driving inductive loads and relatively high repetition rates.

BACKGROUND OF THE INVENTION

A power amplifier that is designed to drive inductive loads typically operates as a high-current switching device. Power amplifiers of this type are used, for example, to drive the yoke mechanism of the horizontal deflection circuitry of a display system employing a cathode ray tube (CRT). Typical prior art deflection amplifiers are described in U.S. Pat. No. No. 4,670,692, 4,642,533, 4,205,259, 3,501,672 and 3,480,826, which are incorporated herein by reference.

The switching rate or operating frequency of the deflection amplifier is one factor that determines the degree of resolution of an image formed on the CRT. As the need has increased for progressively higher resolution, so has deflection amplifier operating frequency. Deflection amplifiers operating at 64–270 kHz or higher are now much desired.

There are several reasons why it is difficult to operate CRT deflection amplifiers and other inductive load amplifiers at comparatively high frequencies. For example, (1) the effect of leakage inductance in the impedance transformer and the impedance of series inductors typically employed in such amplifiers increase with increasing frequency, making it harder to supply sufficient drive to the amplifier, and (2) prior art deflection amplifiers waste power and create dissipation and overheating problems in the amplifier and/or in the circuitry required to drive the amplifier which grow rapidly worse as frequency increases. A further problem with prior art circuits is that they do not provide independent control of the positive and negative current pulses usually employed in such amplifiers with the result that operation of the amplifier is not fully optimized.

BRIEF DESCRIPTION OF THE INVENTION

Accordingly, it is an object of the present invention to provide an improved means and method for driving inductive loads, particularly inductive loads in CRT deflection circuits or the like, and especially those operating at comparatively high repetition rates. It is a further object of the present invention to provide more efficient operation and independent control over the turn-off portion of the amplifier drive cycle. Additionally it is an object to reduce the sensitivity of the drive circuit to variations in individual amplifier characteristics.

These and other objects and advantages are provided in a first embodiment by a circuit comprising: amplifying means for driving an inductive load and having a first output terminal coupled to the inductive load, a second output terminal coupled to a common terminal, and an input terminal; an inductor having first and second terminals wherein the first terminal is coupled to the amplifier input terminal; a transformer having primary and secondary windings each having first and second terminals, wherein the first terminal of the primary is coupled to a switch for supplying current to the primary and the second terminal of the primary is coupled to the second terminal of the inductor, and first terminal of the secondary is coupled to the second terminal of the primary and the second terminal of the secondary is coupled through a unidirectional device to the common terminal; and wherein the transformer windings are arranged so that, when the primary is excited, the first terminals of the primary and secondary have the same polarity.

In a second embodiment there is provided a further improved circuit for driving an inductive load, comprising: amplifying means having a first output terminal coupled to the inductive load, a second output terminal coupled to a common terminal, and an input terminal; an inductor having first and second terminals wherein the first terminal is coupled to the amplifier input terminal; a transformer having primary and secondary windings each having first and second terminals, wherein the first terminal of the primary is coupled to a switch for supplying current to the primary and the second terminal of the primary is coupled to the amplifier input terminal, and first terminal of the secondary is coupled to the second terminal of the inductor and the second terminal of the secondary is coupled through a unidirectional device to the common terminal; and wherein the transformer windings are arranged so that, when the primary is excited, the first terminals of the primary and secondary have the same polarity.

It is desirable that there also be a rectifying means and capacitance means coupled between the first and second amplifier output terminals and a resistance coupled between the amplifier input and common terminals.

There is also provided an improved method for driving an inductive load coupled to the output of an amplifying means whose input is coupled to a transformer primary and secondary through an inductor, comprising: energizing the input of the amplifier through the primary circuit coupled to the amplifier input through the inductor while the secondary circuit of the same transformer coupled to the same amplifier input through the same inductor is substantially blocked from conducting, and thereafter deenergizing the amplifier input through the inductor and transformer secondary while the transformer primary circuit is substantially blocked from conducting.

There is also provided a further improved method for driving an inductive load coupled to the output of an amplifying means whose input is coupled directly to a transformer primary and coupled to the transformer secondary through an inductor, comprising: energizing the input of the amplifier through the primary circuit coupled to the amplifier input while the secondary circuit of the same transformer coupled to the same amplifier input through the inductor is substantially blocked from conducting, and thereafter de-energizing the amplifier input through the inductor and transformer secondary while the transformer primary circuit is substantially blocked from conducting.

These and other aspects, objects and advantages of the present invention will be more fully understood by considering the attached drawings and explanation thereof that follows.

DETAILED DESCRIPTION OF THE DRAWINGS

Figure 1:
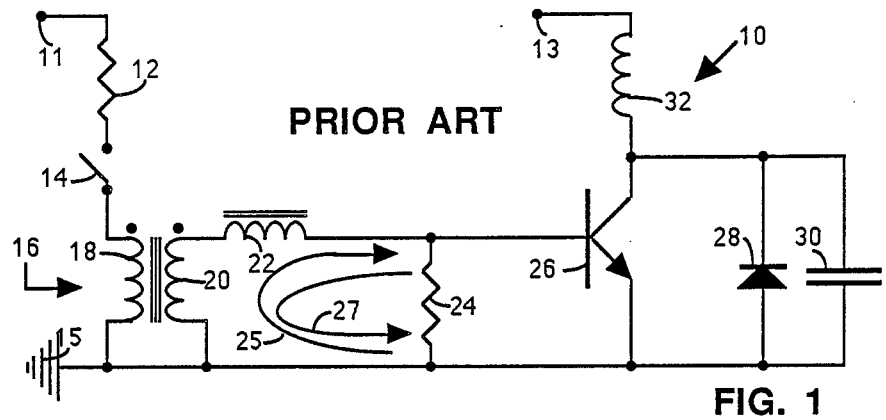
FIG. 1 is a circuit for driving an inductive load such as for example a CRT deflection coil, according to the prior art.

Prior art CRT horizontal deflection amplifier circuit 10, shown in FIG. 1, comprises input power supply connection 11, current limiting resistor 12, switch 14, transformer 16 having primary winding 18 and secondary winding 20, series inductor 22, shunt resistor 24, amplifier 26, snubber diode 28, energy storage capacitor 30 and deflection coil 32. Power supply connection 13 is provided for forcing a current through coil 32 and charging capacitor 30 in response to whether amplifier 32 is conducting or not. Common connection 15 is also provided. Switch 14 may be any type of rapidly operating switch well known in the art for providing an interruptible current path to power supply connection 11. For CRT deflection applications, switch 14 usually operates in a periodic manner with a switching frequency equal to the desired deflection frequency.

Amplifier 26 is typically a high power bipolar transistor, but other amplifying devices and circuits may also be used, as for example, power MOSFETS, Darlingtons and/or BiMOS devices or circuits. As used herein the term "amplifier" is intended to refer to these and other alternatives as will occur to those of skill in the art based on the disclosure herein. For convenience of explanation, the operation of circuit 10 is described using a bipolar type transistor as amplifier 26, however, the principles of operation apply to other amplifiers as well.

When switch 14 is closed current flows through resistor 12 and transformer 16, thereby producing current 25 in the circuit of transformer secondary 20, flowing through inductor 22 into the base of transistor 26. This causes transistor 26 to conduct, discharging capacitor 30 and permitting a current to flow through deflection coil 32 and amplifier 26 to reference terminal 15. The build-up of current through coil 32 is limited by its inductance so that the desired rising current ramp is obtained through deflection coil 32. This corresponds to the "sweep" portion of the CRT deflection cycle.

When switch 14 is opened, the collapsing magnetization field in transformer 16 causes the polarity at the terminals of secondary 20 to reverse so that oppositely directed current 27 now flows through the input of amplifier 26, inductor 22 and secondary winding 20. Amplifier 26 turns off and any charge stored in the input of amplifier 26 is removed. Inductor 22 limits the magnitude of current 27 so as to prevent damage to amplifier 26.

When amplifier 26 turns off, the collapsing magnetization energy stored in deflection coil 32 produces a current in the same direction through coil 32 which is absorbed charging capacitor 30. The L and C values of coil 32 and capacitor 30 are chosen to regulate the rate of change of the decreasing current ramp, which corresponds to the "fly-back" portion of the CRT deflection cycle. Resistor 24 is conveniently provided across the input terminals of amplifier 26 to aid in suppressing parasitic switching transients, but is not essential.

One of the difficulties associated with prior art circuit 10 is that inductor 22 is in series with the input of amplifier 26 during both the turn-on and turn-off portions of the deflection drive cycle. During the turn-on portion of the input drive to amplifier 26, inductor 22 adds impedance to the input drive circuit, thereby requiring that larger drive voltages be provided through switch 14. Also, the series resistance of inductor 22 adds to the power loss in the circuit during turn-on. Further, the the energy stored in inductor 22 during the turn-on portion of the amplifier input drive, opposes the oppositely directed base current flow during the turn-off portion of the input drive cycle, thereby making it more difficult to turn off amplifier 26.

Figure 4A:
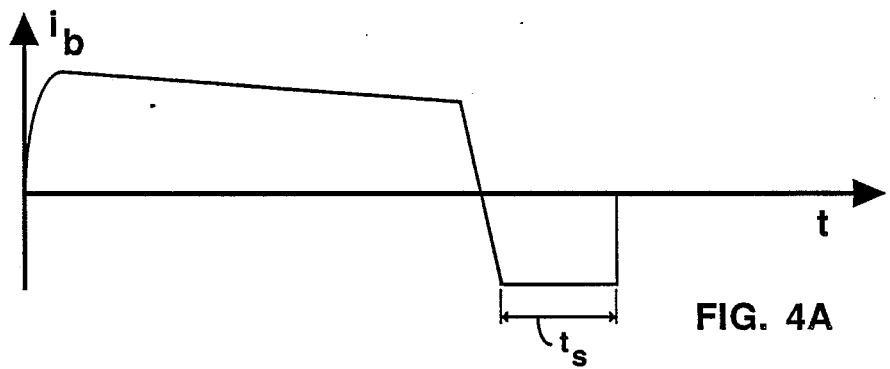
FIGS. 4A-C show amplifier input current waveforms ($i_b$) versus time (t) for the circuits of FIGS. 1-3, respectively.

A further difficulty is that turn-on current 25 and turn-off current 27 are not independently controllable. Also, substantial power is dissipated in current limiting resistor 12. In addition, the relatively square base input current ($i_b$) pulse shape during turn-on (see FIG. 4A) increases the charge stored in the amplifier which must be extracted during turn-off and increases the power dissipated in amplifier 26. Further, the operation of the circuit of FIG. 1 is relatively sensitive to variation in amplifier characteristics. These are significant problems.

Other prior art circuits are known to have various combinations of these difficulties, some more, some less. Accordingly, a need continues to exist for circuits and methods that avoid some or all of these problems.

Figure 2:
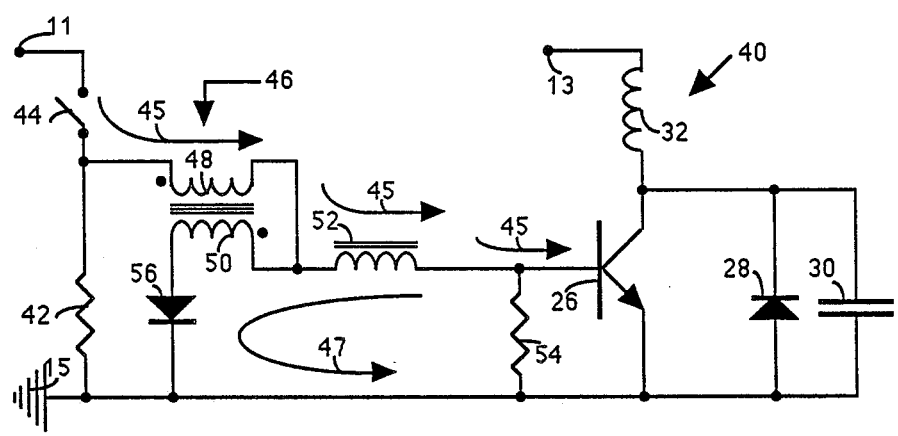
FIG. 2 is a circuit for driving an inductive load such as for example a CRT deflection coil, according to a first embodiment of the present invention.

The circuit illustrated in FIG. 2 overcomes several of the above-noted problems. FIG. 2 shows inductive load drive circuit 40, according to a first embodiment of the present invention.

Circuit 40 comprises input switching device 44 analogous to switch 14 of FIG. 1, parasitic suppression resistor 42, transformer 46 having primary 48 and secondary 50, inductor 52, amplifier means 26, e.g., a bipolar transistor, resistor 54 and unidirectional conducting means 56, e.g., a diode or equivalent, coupled substantially as shown. Deflection coil 32, diode 28, capacitor 30 and power connections 11 and 13 and reference connection 15 are the same as in FIG. 1. Primary 48 and secondary 50 of transformer 46 have the indicated polarity relationship, i.e., the black dots adjacent the windings indicating the ends of the windings having the same polarity when, for example, the primary is excited.

When switch 44 is closed, current 45 flows through primary winding 48, inductor 52 and into the input of amplifier 26. This causes amplifier 26 to turn on. There is no current flow in transformer secondary 50 because conduction in the circuit of secondary 50 is blocked by diode 56. Resistor 54 is analogous to resistor 24 and is provided to assist in suppressing parasitic switching transients. The operation of the output circuit of amplifier 26, including deflection coil 32, capacitor 30 and snubber diode 28, is substantially the same as described in connection with this portion of FIG. 1.

during the turn-on portion of the amplifier input drive when switch 44 is closed, transformer 46 acts as an inductor having an inductance determined by primary winding 48 which provides primary control of the rate of rise of input drive current 45. Thus, control over input current and amplifier turn-on is improved by virtue of the ability to separately select the primary inductance. The presence of diode 56 prevents transformer action during the turn-on portion of the input drive to amplifier 26.

When switch 44 is opened (or the input drive otherwise interrupted), the collapsing magnetization in the transformer windings causes current 47 having the opposite direction to input drive current 45 to flow in the secondary circuit comprising the input to amplifier 26, inductor 52, secondary winding 50 and diode 56 which is now forward biased. Inductor 52 primarily limits the fall time of the turn-off portion of the amplifier input drive corresponding to current 47.

Figure 4B:
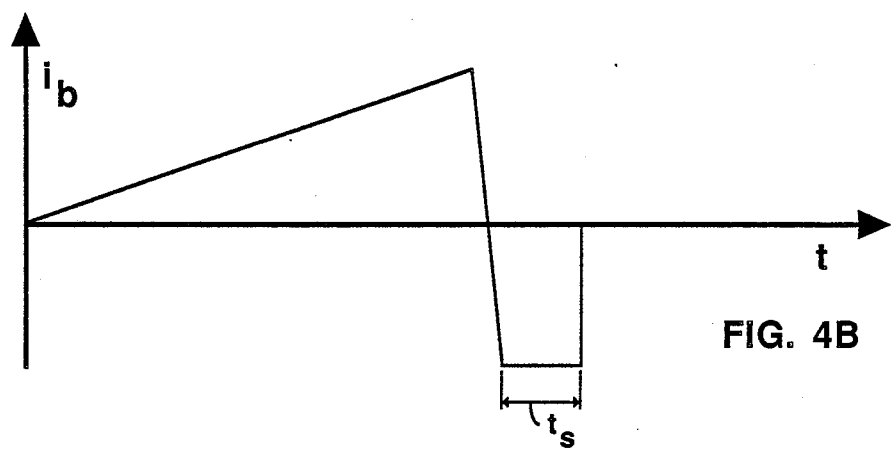

FIG. 4B shows the direction and relative magnitude of the amplifier input current versus time for the circuit of FIG. 2. It will be seen that a positive going ramp is obtained during amplifier input turn-on and a negative going saturated ramp is obtained during turn-off. Further, because the shape of the turn-on portion is primarily controlled by the inductance of primary winding 48 and the shape of the turn-off portion is primarily determined by the inductance of inductor 52, the ability to separately control the turn-on and turn-off portions of the amplifier input drive is improved. Further, the saturated portion of the turn-off input drive may be adjusted by selecting the turns ratio of transformer 46, providing additional control over operation of the power amplifier.

Even though the performance of the circuit of FIG. 2 is improved over that of the prior art, some difficulties still remain. For example, the turn-on charging current still passes through inductor 52, so that its internal losses waste energy during both turn-on and turn-off. Further, its reactance during the turn-on portion still contributes to increasing the required drive voltage. Finally, the energy stored in inductor 52 during turn-on makes it more difficult to turn off transistor 26, since the collapsing magnetization field of inductor 52 produces an EMF tending to maintain current 45 and opposing current 47.

Figure 3:
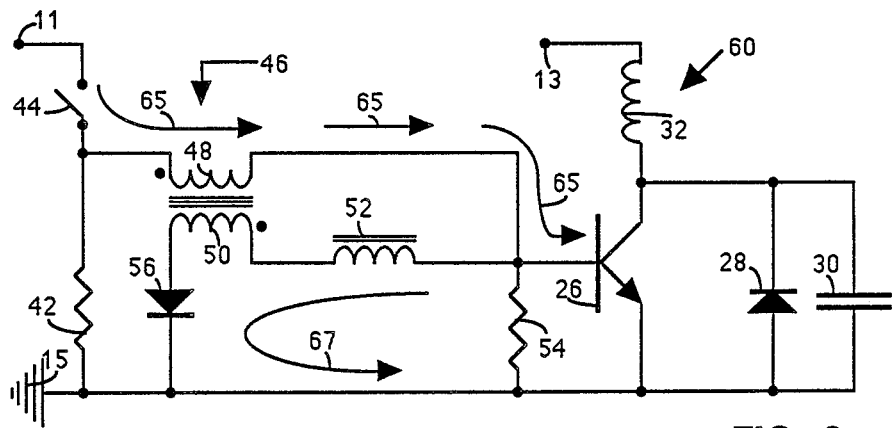
FIG. 3 is a circuit for driving an inductive load such as for example a CRT deflection coil, according to a further embodiment of the present invention.
Figure 4C:
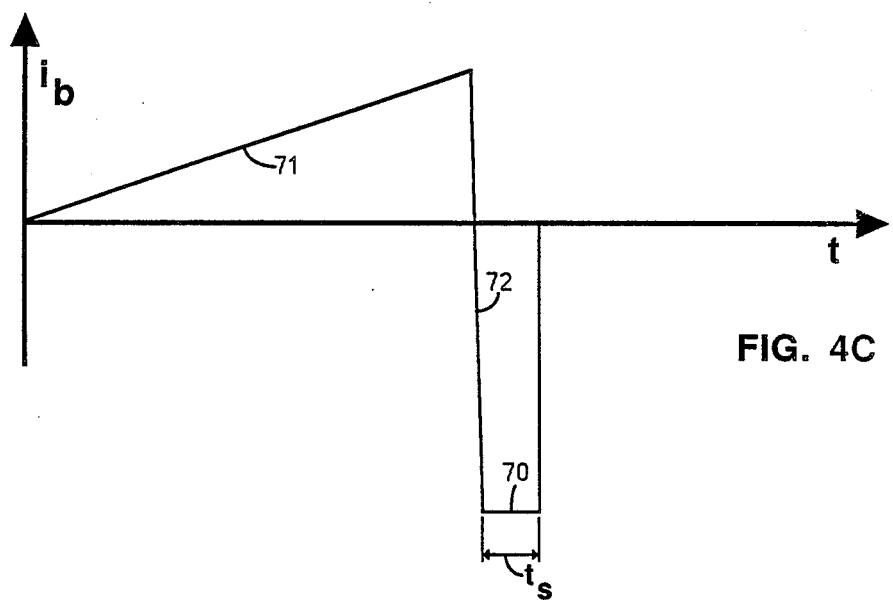

A further improved circuit is shown in FIG. 3, which is preferred. The waveform associated with the amplifier input drive current 65, 67 of the circuit of FIG. 3 is shown in FIG. 4C. Drive circuit 60 of FIG. 3 is similar to that of FIG.2 and has substantially the same components, except that primary winding 48 is coupled to the input of amplifier 26 without passing through inductor 52. The operation of circuit 60 of FIG. 3 differs from that of circuit 40 of FIG. 2 in that, during input turn-on when switch 44 is closed, input current 65 flows through primary winding 48 into the input of amplifier 26 without passing through inductor 52. As before, transformer 46 functions as an inductor determined by the inductance of primary winding 48. Thus, the rate of rise of the input drive current during the turn-on portion of the amplifier input may be substantially independently selected by choosing the inductance of primary 48. It should also be noted that there is no series resistance in the input circuit other than the parasitic resistance of the transformer primary and circuit wiring, which may be made relatively small. The series resistance of inductor 52 is not in the circuit during turn-on. Thus, power dissipation is reduced.

When switch 44 is opened, the circuit of FIG. 3 behaves substantially as that of as FIG. 2. Turn-off current 67 flows in the opposite direction, driven by the collapsing magnetization field of the transformer primary inducing current flow through secondary winding 50. Since the direction of current flow is opposite to that of charging current 65, diode 56 is now forward biased. Inductor 52 substantially controls the fall time of turn-off current 67 and the turns ratio of transformer 46 may be adjusted to control maximum (saturation) negative value 70 of turn-off current 67 (see FIG. 4C). Further, since inductor 52 in FIG. 3 is not conducting during turn-on, there is no magnetization field whose collapse would generate an EMF opposing turn-off current 67. Thus, turn-on rate of rise 71, turn-off rate of fall 72 and maximum turn-off drive 70 are decoupled. These features provide substantial advantages in optimizing the performance of amplifier 26 so that improved results are obtained for the same intrinsic transistor capabilities.

A further advantage of the circuit of FIG. 3 is that the energy which was previously stored in inductor 52 in the circuits of FIGS. 1–2, and which opposed removal of the charge stored in the input of amplifier 26 and which was wasted, is no longer present. This energy is given by $\frac{1}{2} L_{52}[I(25)_{peak}]^2$ or $\frac{1}{2} L_{52}[I(45)_{peak}]^2$, where $L_{52}$ stands for the inductance of inductor 52 and $I(25)_{peak}$ and $I(45)_{peak}$ indicate the peak values of turn-on input charging currents 25 and 45, respectively. Hence a much smaller fall time and an independently adjustable fall time is achieved without interference with other performance characteristics. In addition, dissipation is reduced.

Further, the magnitude of the circuit components may be arranged so that the energy needed to turn off amplifier 26 is provided by the energy stored in primary winding 48 of transformer 46 substantially independent of the other components. This stored energy is $\frac{1}{2} L_p[I(65)_{peak}]^2$, where $L_p$ stands for the inductance of primary winding 48 of transformer 46 and $I(65)_{peak}$ stands for the peak value of turn-on input charging current 65. The amount of energy needed to turn-off amplifier 26 is frequently substantial. By using the energy temporarily stored in transformer 46 during turn-on to provide the turn-off drive, the total energy is substantially conserved and overall dissipation is significantly reduced without sacrifice of other performance characteristics. Other than parasitics, the input drive is substantially lossless. This is a great advantage.

EXAMPLE

By way of example, an amplifier drive circuit suitable for driving inductive loads such as are encountered in CRT horizontal deflection is implemented with voltage of typically 6 volts at power supply connection, resistor 42 of 470 Ohms (1 Watt), transformer 46 of Type 1811P-3C8 manufactured by Feroxcube of Saugerties, N.Y. with a turns ratio of about 12:4 and primary inductance of 50 microHenries, inductor 52 of about 2 microHenries, resistor 54 of about 22 Ohms (1 Watt), diode 56 of Motorola Type MUR110 rectifier and amplifier 26 of Motorola Type MJH16206 bipolar transistor manufactured by Motorola, Inc. of Phoenix, Ariz. Other components are conventional. The voltage of supply connection 13 and output components 28, 30, are chosen depending upon the desired properties of deflection coil 32 using means well known in the art.

The circuits of FIGS. 1–3 were compared using the same amplifier transistor and operating at the same frequencies under substantially the same conditions. Three important parameters are considered; the storage time $t_s$ (see FIGS. 4A–C) during which the charge stored in the amplifier is being extracted, the switching power loss (SWPL) in the circuit and the variation $\Delta t_f$ in collector current fall time $t_f$ observed due to variations in individual transistor characteristics. The results are presented in the following table, normalized to the behavior of the circuit of FIG. 1.

| RELATIVE AMPLIFIER DRIVE CIRCUIT PERFORMANCE | | | |
|---|---|---|---|
| | CIRCUIT | | |
| PARAMETER | FIG. 1 | FIG. 2 | FIG. 3 |
| $t_s$ | 1.0 | 0.7 | 0.5 |
| SWPL | 1.0 | 0.7 | 0.4–0.5 |
| $\Delta t_f$ | 1.0 | 0.3 | 0.1 |

These results show that the invented circuits provide significantly improved (smaller) storage times and substantially improved (smaller) power dissipation. These improvements are very important in practical applications.

The $\Delta t_f$ values shown in the table illustrate how the fall time $t_f$ changes in the several circuits when transistors having varying individual characteristics are plugged in as amplifier 26. For example, if two transistors yield differences in $t_f$ amounting to $\Delta t_f = 100$ nanoseconds in the circuit of FIG. 1, then according to the data in the table, the same two transistors substituted in the circuits of FIGS. 2 and 3 would show $\Delta t_f$ values of 30 and 10 nanoseconds, respectively. The reduction in $\Delta t_f$ is extremely important because it indicates that the invented circuits are much more tolerant of unavoidable device characteristic variations. This is greatly to be desired.

Having thus described the invention, those of skill in the art will appreciate that the invented circuit and method provide substantial improvement over the prior art by increasing the degree of freedom in independently setting the input operation of the amplifier for driving inductive loads during amplifier input turn-on, turn-off and turn-off saturation, that power dissipation is substantially reduced, and that the sensitivity to variations in transistor characteristics is much reduced. The invented means and method are especially well suited for driving inductive loads such as are encountered in high speed CRT deflection power amplifiers.

While the present invention has been illustrated in terms of an elementary input switching means and of a bipolar transistor output amplifier driving an inductive load coupled to a capacitor and diode and of various resistors for parasitic transient suppression, it will be apparent to those of skill in the art based on the teachings herein that various modifications and additions may be made to the present invention without departing from the spirit thereof, as for example and not by way of limitation, by employing other types of output amplifying devices and/or circuits and other types of input switching means and other components or combinations for suppressing switching transients and other circuit configurations for coupling the amplifier output to the inductive load. Accordingly, it is intended to incorporate these and other variations as will occur to those of skill in the art based on the teachings herein in the claims that follow.

I claim:
1. A circuit for driving an inductive load, comprising:
   amplifying means having a first output terminal coupled to the inductive load, a second output terminal coupled to a common terminal, and an input terminal;
   an inductor having first and second terminals wherein the first terminal is coupled to the amplifier input terminal;
   a transformer having primary and secondary windings each having first and second terminals, wherein the first terminal of the primary is coupled to a switch for supplying current to the primary and the second terminal of the primary is coupled to the second terminal of the inductor, and first terminal of the secondary is coupled to the second terminal of the primary and the second terminal of the secondary is coupled through a unidirectional device to the common terminal; and
   wherein the transformer windings are arranged so that the first terminals of the primary and secondary have the same polarity.
2. The circuit of claim 1 further comprising rectifying means coupled between the first and second amplifier output terminals.
3. The circuit of claim 2 further comprising means for providing capacitance coupled between the first and second amplifier output terminals.
4. The circuit of claim 1 further comprising resistive means coupled between the amplifier input and the common terminal.
5. A circuit for driving an inductive load, comprising:
   amplifying means having a first output terminal coupled to the inductive load, a second output terminal coupled to a common terminal, and an input terminal;
   an inductor having first and second terminals wherein the first terminal is coupled to the amplifier input terminal;
   a transformer having primary and secondary windings each having first and second terminals, wherein the first terminal of the primary is coupled to a switch for supplying current to the primary and the second terminal of the primary is coupled to the amplifier input terminal, and first terminal of the secondary is coupled to the second terminal of the inductor and the second terminal of the secondary is coupled through a unidirectional device to the common terminal; and
   wherein the transformer windings are arranged so that the first terminals of the primary and secondary have the same polarity.
6. The circuit of claim 5 further comprising rectifying means coupled between the first and second amplifier output terminals.
7. The circuit of claim 6 further comprising means for providing capacitance coupled between the first and second amplifier output terminals.
8. The circuit of claim 5 further comprising resistive means coupled between the amplifier input and the common terminal.
9. A method for driving an inductive load coupled to the output of an amplifying means whose input is coupled to a transformer primary and secondary through an inductor, comprising, energizing the input of the amplifier through the primary circuit coupled to the amplifier input through the inductor while the secondary circuit of the same transformer coupled to the same amplifier input through the same inductor is substantially blocked from conducting, and thereafter de-energizing the amplifier input through the inductor and transformer secondary while the transformer primary circuit is substantially blocked from conducting.
10. The method of claim 9 wherein the step of energizing the input of the amplifier through the primary circuit coupled to the amplifier input through the inductor while the secondary circuit of the same transformer coupled to the same amplifier input through the same inductor is substantially blocked from conducting, comprises, blocking conduction in the transformer secondary circuit by means of a unidirectional device.

11. The method of claim 9 wherein the step of de-energizing the amplifier input through the inductor and transformer secondary while the transformer primary circuit is substantially blocked from conducting, comprises, de-energizing the input of the amplifier means through a forward biased diode in series with the transformer secondary.

12. A method for driving an inductive load coupled to the output of an amplifying means whose input is coupled directly to a transformer primary and coupled to the transformer secondary through an inductor, comprising, energizing the input of the amplifier through the primary circuit coupled to the amplifier input while the secondary circuit of the same transformer coupled to the same amplifier input through the inductor is substantially blocked from conducting, and thereafter de-energizing the amplifier input through the inductor and transformer secondary while the transformer primary circuit is substantially blocked from conducting.

13. The method of claim 12 wherein the step of energizing the input of the amplifier through the primary circuit coupled to the amplifier input while the secondary circuit of the same transformer coupled to the same amplifier input is substantially blocked from conducting, comprises, blocking conduction in the transformer secondary circuit by means of a unidirectional device.

14. The method of claim 12 wherein the step of de-energizing the amplifier input through the inductor and transformer secondary while the transformer primary circuit is substantially blocked from conducting, comprises, de-energizing the input of the amplifier means through a forward biased diode in series with the transformer secondary.

* * * * *